United States Patent
Gabara (10) Patent No.: US 6,597,225 B1
(45) Date of Patent: Jul. 22, 2003

(54) DATA CAPTURE CIRCUIT WITH SERIES CHANNEL SAMPLING STRUCTURE

(75) Inventor: Thaddeus John Gabara, Murray Hill, NJ (US)

(73) Assignee: Agere Systems Inc., Allentown, PA (US)

(*) Notice: Subject to any disclaimer, the term of this patent is extended or adjusted under 35 U.S.C. 154(b) by 0 days.

(21) Appl. No.: 10/104,248

(22) Filed: Mar. 22, 2002

(51) Int. Cl.[7] .............................................. H03K 3/356
(52) U.S. Cl. ...................................................... 327/211
(58) Field of Search .............................. 327/51, 52, 55, 327/57, 89, 91, 199–201, 203, 208, 210–215, 219, 223

(56) References Cited

U.S. PATENT DOCUMENTS

| | | | |
|---|---|---|---|
| 4,767,949 A | | 8/1988 | Mayweather, III |
| 5,239,206 A | * | 8/1993 | Yanai ......................... 327/202 |
| 5,563,531 A | | 10/1996 | Meyer |
| 5,576,837 A | | 11/1996 | Strolle et al. |
| 5,606,625 A | | 2/1997 | Dallavalle et al. |
| 5,636,252 A | | 6/1997 | Patel et al. |
| 5,790,063 A | | 8/1998 | Koifman et al. |
| 5,877,718 A | | 3/1999 | Andoh et al. |
| 5,929,660 A | * | 7/1999 | Dillinger ..................... 327/57 |
| 6,097,768 A | | 8/2000 | Janesch et al. |
| 6,111,444 A | * | 8/2000 | Mikan et al. ............... 327/211 |
| 6,191,623 B1 | | 2/2001 | Gabara |
| 6,278,308 B1 | * | 8/2001 | Partovi et al. .............. 327/218 |
| 6,380,780 B1 | * | 4/2002 | Aitken et al. ............... 327/202 |
| 6,396,309 B1 | * | 5/2002 | Zhao et al. .................. 327/55 |
| 6,433,601 B1 | * | 8/2002 | Ganesan ..................... 327/202 |

OTHER PUBLICATIONS

U.S. patent application Ser. No. 09/870,436, Gabara, filed May 30, 2001.
U.S. patent application Ser. No. 09/162,852, Gabara et al., filed Sep. 29, 1998.
J. Montanaro et al., "A 160–MHz, 32–b, 0.5–W CMOS RISC Microprocessor," IEEE Journal of Solid–State Circuits, vol. 31, No. 11, pp. 1703–1714, 1996.
J.–C. Kim et al., "CMOS Sense Amplifier–Based Flip–Flop with Two N–C$^2$MOS Output Latches," Electronics Letters, vol. 36, No. 6, pp. 498–500, 2000.
R. Gregorian et al., "Analog MOS Integrated Circuits for Signal Processing," Chapter Four, pp. 121–126, John Wiley & Sons, 1986.

* cited by examiner

Primary Examiner—My-Trang Nu Ton
(74) Attorney, Agent, or Firm—Ryan, Mason & Lewis, LLP (57) ABSTRACT

A data capture circuit includes a series channel sampling structure coupled to an evaluation element. The series channel sampling structure includes a plurality of series-connected transistor devices configured for operation under the control of at least one clock signal to connect an input signal, applied to an input of the series channel sampling structure, to an input of the evaluation element, and to subsequently disconnect the input signal from the input of the evaluation element. Advantageously, the series channel sampling structure can be configured and clocked in a manner that ensures that connection of the input signal to the input of the evaluation element occurs only at or near transitions of the clock signal, such that power dissipation in the data capture circuit is reduced and its speed of operation can be increased.

13 Claims, 6 Drawing Sheets

DATA CAPTURE CIRCUIT WITH SERIES CHANNEL SAMPLING STRUCTURE

FIELD OF THE INVENTION

The present invention relates generally to electronic data capture circuits, such as circuits which each include one or more flip-flops, memory cells or input latches, and more particularly to signal sampling techniques for use in such circuits.

BACKGROUND OF THE INVENTION

Data capture circuits include circuits such as flip-flops, memory cells and latches, as well as sense amplifiers and other types of comparators, and are commonly used in a wide variety of integrated circuit applications.

A problem that can arise in conventional data capture circuits relates to the manner in which signals are introduced into the circuits. For example, in the case of a sense amplifier, an input signal and its Boolean complement are typically introduced or "sampled" at corresponding complementary inputs of the sense amplifier during an initialization mode of operation. Typically, a conventional sense amplifier is configured such that these complementary input signals remain connected to the corresponding input structures of the circuit while the circuit is making its decision regarding the introduced input signals, that is, while the circuit is in an evaluation mode of operation after completion of the initialization mode. This is generally not a problem when the inputs are Boolean complements of one another. However, in situations in which the inputs are non-complementary, leaving the inputs connected during the evaluation mode can lead to an undesirable increase in the power dissipation of the circuit.

Sense amplifiers and other comparators which process non-complementary inputs are described in U.S. patent application Ser. No. 09/870,436, filed May 30, 2001 in the name of inventor Thaddeus J. Gabara and entitled "Comparator Circuits Having Non-Complementary Input Structures," which is hereby incorporated by reference herein. This U.S. Patent Application describes a number of exemplary comparator circuits which provide substantial improvements relative to conventional circuits in terms of reduced power dissipation, transistor count and throughput delay. In an illustrative embodiment described therein, the above-described problem relating to leaving non-complementary inputs connected during an evaluation mode is addressed through the use of multiple non-complementary clock signals. However, such an approach typically requires additional circuitry and careful control of related timing and delay issues.

Despite the considerable advancements provided by the circuits described in the above-cited U.S. Patent Application, a need remains for further improvements in these and other types of data capture circuits. For example, improved techniques are needed for the sampling of non-complementary input signals in data capture circuit applications, so as to avoid the additional circuitry, timing and delay issues associated with the above-described multiple clock signal approach.

SUMMARY OF THE INVENTION

The present invention meets the above-identified need by providing data capture circuits having improved sampling structures.

In accordance with one aspect of the present invention, a data capture circuit includes a series channel sampling structure coupled to an evaluation element such as a memory cell. The series channel sampling structure includes a plurality of series-connected transistor devices configured for operation under the control of at least one clock signal to connect an input signal, applied to an input of the series channel sampling structure, to an input of the evaluation element, and to subsequently disconnect the input signal from the input of the evaluation element.

Advantageously, the series channel sampling structure can be configured and clocked in a manner that ensures that connection of the input signal to the input of the evaluation element occurs only at or near transitions of the clock signal, such that power dissipation in the data capture circuit is reduced and its speed of operation can be increased.

In an illustrative embodiment of the invention, the series channel sampling structure comprises a pair of metal oxide semiconductor (MOS) transistors having their channels connected in series. For example, the series channel sampling structure may be a series P-N channel sampling structure comprising a P-type MOS (PMOS) transistor and an N-type MOS (NMOS) transistor having their channels connected in series. In this case, the same clock signal is preferably applied to gate terminals of both the PMOS and NMOS transistors. As another example, the series channel sampling structure may be a series N-N channel sampling structure or a series P-P sampling structure, each comprising a pair of NMOS or PMOS transistors having their channels connected in series. In this case, a first clock signal may be applied to a gate terminal of one of the transistors and a complemented version of the first clock signal may be applied to a gate terminal of the other transistor.

In accordance with another aspect of the invention, in an embodiment in which the series channel sampling structure comprises a pair of MOS transistors having their channels connected in series, a first clock signal is applied to a gate terminal of a first one of the MOS transistors and a complemented version of the first clock signal is applied to a gate terminal of the other MOS transistor. An amount of delay may be introduced between a transition of the first clock signal and a corresponding transition in the complemented version of the first clock signal, such that the series channel sampling structure remains conductive after the transition of the first clock signal for a period of time corresponding to the amount of introduced delay.

In accordance with a further aspect of the invention, the data capture circuit may comprise a first series channel sampling structure coupled to a first node of the evaluation element and a second series channel sampling structure coupled to a second node of the evaluation element, with each of the series channel sampling structures being operative to connect and disconnect a corresponding input signal from the associated node of the evaluation element under the control of at least one clock signal. The input signals may be non-complementary input signals.

The invention can be used to implement flip-flops, memory cells and latches, as well as sense amplifiers and other types of comparators, having reduced power consumption and improved speed of operation.

DETAILED DESCRIPTION OF THE INVENTION

The present invention will be illustrated herein using exemplary data capture circuits. It should be understood, however, that the invention is more generally suitable for use in any data capture application in which it is desirable to provide improved signal sampling performance. It is therefore to be appreciated that the invention is suitable for use with circuit structures other than those specifically described herein. In addition, the invention can be used to implement a data capture circuit having two inputs, three inputs, or more than three inputs. In the illustrative data capture circuits, supply voltage Vss is illustrated as ground, but can be a particular non-zero voltage level, as is well known. Also, those skilled in the art will recognize that the polarity of the transistor devices in a given circuit generally may be altered, e.g., p-channel device configurations may have corresponding n-channel device configurations and vice versa. Moreover, the described metal oxide semiconductor (MOS) device circuits can be implemented using other transistor technologies, such as bipolar junction transistors (BJTs), GaAs transistors, and other technologies, as well as combinations thereof.

The term "data capture circuit" as used herein is intended to include any circuit having one or more data capture elements.

The term "data capture element" is intended to include a flip-flop, memory cell, latch, sense amplifier or other comparator, or any other type of circuit or circuit element capable of capturing data.

The term "non-complementary" refers to two or more input signals, structures or other elements which are not Boolean complements of one another, e.g., are not implemented as complements of one another in accordance with the well-known DeMorgan rule.

In accordance with one aspect of the present invention, an improved sampling structure is provided for a data capture circuit. The sampling structure is referred to herein as a "fast" sampling structure because it allows for quicker introduction of a signal into a data capture circuit than is possible using certain of the conventional techniques described previously. Moreover, the sampling structure when implemented in a sense amplifier or other type of data capture circuit avoids the additional circuitry, timing and delay issues associated with the above-described multiple clock signal approach.

Figure 1:
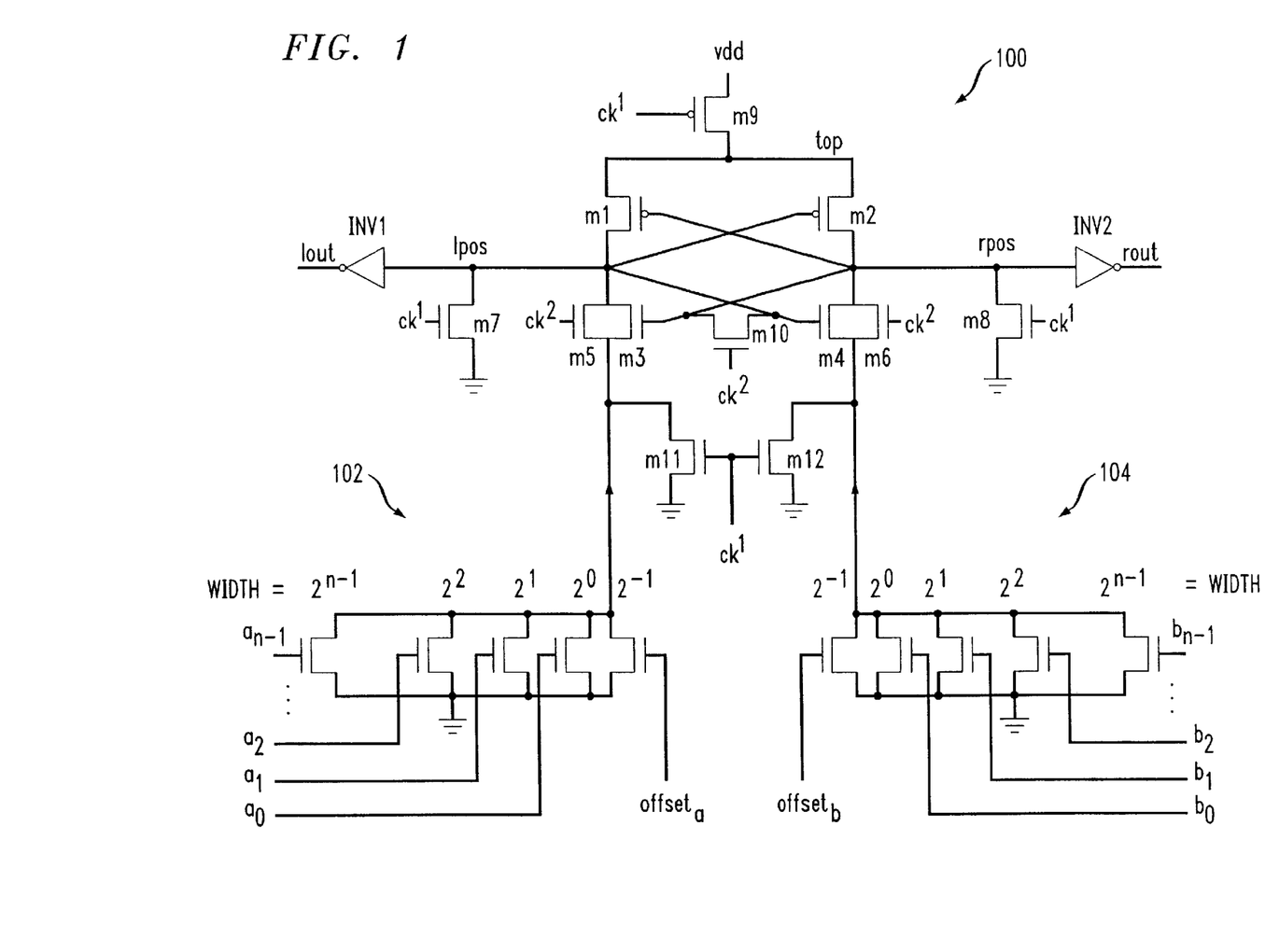
FIG. 1 is a schematic diagram of an example data capture circuit in which the present invention may be implemented.

FIG. 1 shows an example data capture circuit 100 in which the present invention may be implemented. The circuit 100 is a non-complementary multi-bit digital comparator circuit of a type described in the above-cited U.S. patent application Ser. No. 09/870,436 entitled "Comparator Circuits Having Non-Complementary Input Structures," and utilizes the multiple clock signal approach mentioned previously in order determine the relative weight of digital words. The circuit 100 includes a left input leg 102 and a right input leg 104. The input legs 102 and 104 are also referred to as evaluation legs.

Transistors m1, m2, m3 and m4 form a cross-coupled random access memory (RAM) cell that compares input signals applied to the two legs 102 and 104 during evaluation. The result of this evaluation is reflected in the output signals lout and rout from respective inverters INV1 and INV2. The inverters INV1 and INV2 also serve to isolate the evaluation of the nodes lpos and rpos from the outputs lout and rout, such that the evaluation of the RAM cell becomes independent of any possible output loading asymmetry associated with outputs lout and rout. Transistors m7 and m8 are configured for initializing the respective nodes lpos and rpos to ground. The circuit also includes transistors m5, m6 and m9 through m12 arranged as shown. The transistors m1, m2 and m9 are P-type MOS (PMOS) devices, and the transistors m3, m4, m5, m6, m7, m8, m10, m11 and m12 are N-type MOS (NMOS) devices.

Each of the legs 102 and 104 also includes a corresponding weighted array of transistors that is used to provide a variable resistance which is a function of a corresponding applied n-bit digital word $A=a_0, a_1, a_2, \ldots a_{n-1}$ or $B=b_0, b_1, b_2, \ldots b_{n-1}$. Within a given evaluation leg, each of the bits of a given multi-bit input word is applied to the gate of a corresponding transistor. The widths of the transistors are sized in accordance with the significance of their corresponding bits, i.e., the transistor corresponding to the most significant bit (MSB) $a_{n-1}$ of the input word A is associated with the $2^{n-1}$ width, while the transistor corresponding to the least significant bit (LSB) $a_0$ of the input word A is associated with the $2^0$ width. The transistors of the weighted array associated with input word B are sized in a similar manner.

The example weighted array structures of FIG. 1 can compare the strengths of the two n-bit digital input words A and B. For example, assume n=8 and the input A=10101010 while B=10101011. Since B>A, the right array resistance will be less than the left array resistance, such that the circuit 100 will evaluate to lout=0 and rout=1.

If both inputs A and B are equal, the weighted arrays indicate a tie and the output of the circuit 100 may have either a "1" or "0" value after being evaluated. This is also known as a "metastable" condition. In some applications, this uncertainty is acceptable. In other applications, knowledge of equality is important and the circuit behavior should remain consistent after evaluation to ensure a consistent output. This issue is addressed in the circuit 100 by incorporating an offset capability into each of the arrays. More specifically, a signal offset$_a$ or offset$_b$ is applied to a gate of an additional transistor in the corresponding array. This additional transistor has a width corresponding to a digital weighting of less than $2^0$, in this case corresponding to a digital weighting of $2^{-1}$. The width of the additional transistor in this embodiment is thus one-half that of the next smallest transistor in the array, i.e., the transistor associated with the $2^0$ weighting.

It should be noted that, in certain applications, the offset transistor can have the same or smaller width than that of the transistor associated with the $2^0$ weighting but may also or alternatively have a gate length that is longer than that of the $2^0$ transistor, such that its resulting behavior will provide the desired offset function. In other words, by appropriate selection of parameters such as gate length, the behavior of the offset transistor may be made to approximate that of a device weighted by $2^{-1}$ in width even though its actual width may be substantially the same as that of the $2^0$ transistor.

The offset signal for one or both of the weighted arrays can be set to a constant potential or may have been generated in a previous operation. If it is a constant potential, e.g., left array offset signal offset$_a$=Vdd, right array offset signal offset$_b$=0, then in a tie, the left array will always have the lower resistance. Other combinations of offset signal values can also be used to ensure that a particular array "wins" if the A and B inputs are equal. Even in the case where both A and B inputs are zero, the offset ensures that the output of the comparator circuit 100 will not be indeterminate.

As is apparent from the figure, there are multiple non-complementary clock signals, i.e., clock signals ck$^1$ and ck$^2$, being applied to the circuit 100. Clock signal ck$^1$ is applied to the gates of transistors m7, m8, m9, m10, m11 and m12. Clock signal ck$^2$ may be a delayed version of ck$^1$, and is applied to the gates of transistors m5, m6 and m10.

Additional details regarding the operation of circuit 100 can be found in the above-cited U.S. patent application Ser. No. 09/870,436.

The circuit 100 addresses the above-described problem relating to leaving non-complementary inputs connected during an evaluation mode through the use of the multiple clock signals ck$^1$ and ck$^2$. However, it would be desirable if this problem could be addressed in a manner that eliminates the need for multiple non-complementary clock signals, and the associated additional circuitry and timing and delay issues.

As noted above, the present invention in accordance with one aspect thereof provides an improved sampling structure that may be implemented in the circuit 100 of FIG. 1 as well as in other types of data capture circuits.

Figure 2A:
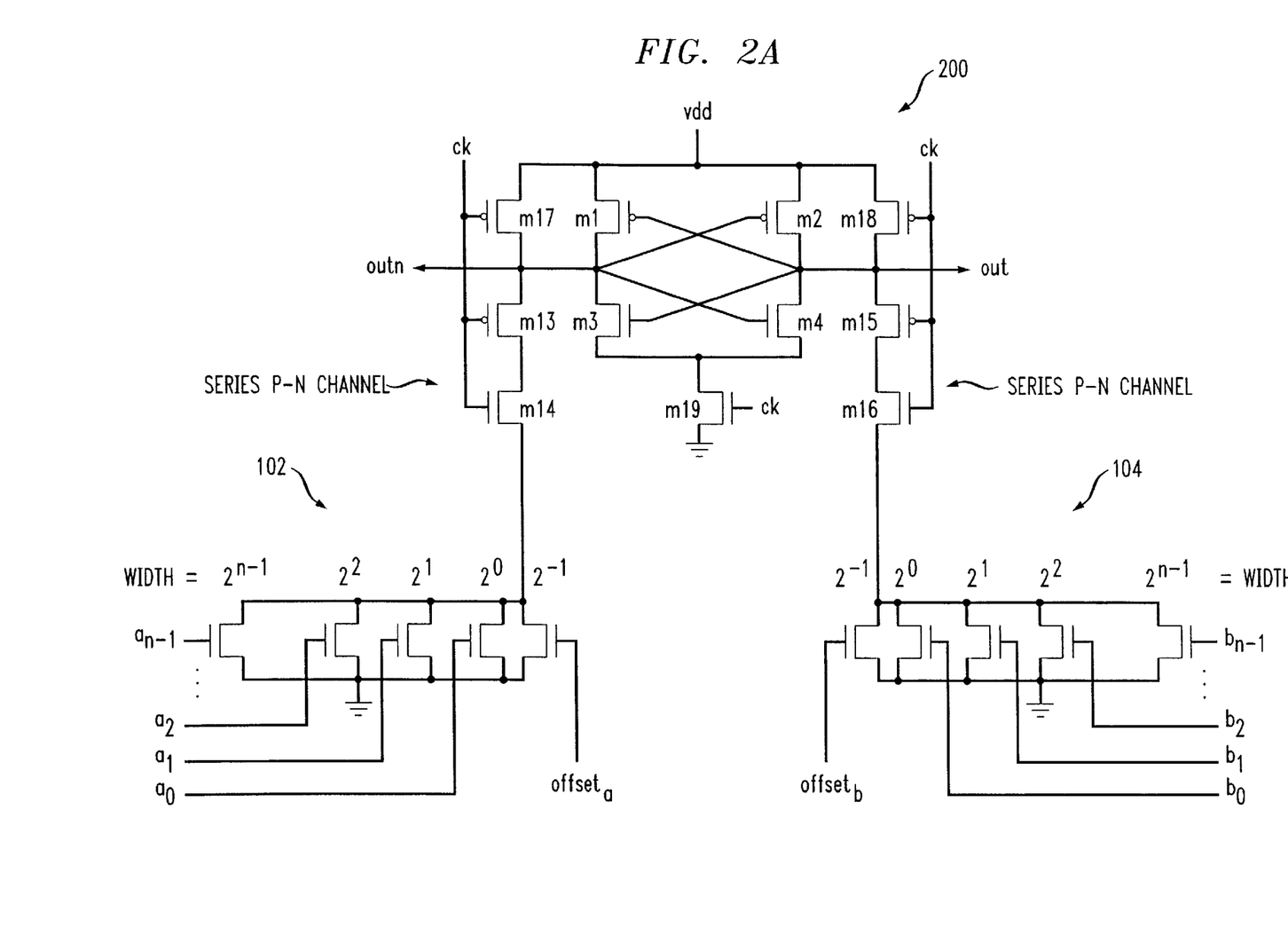
FIGS. 2A and 2B illustrate the manner in which the FIG. 1 data capture circuit is illustratively modified to include an improved sampling structure in accordance with the present invention.

FIG. 2A shows a data capture circuit 200 which corresponds generally to the circuit 100 of FIG. 1 but includes an improved input sampling structure in accordance with the invention. The circuit 200 includes the left input leg 102 and right input leg 104, and transistors m1, m2, m3 and m4 forming a cross-coupled RAM cell, all as previously described in conjunction with FIG. 1. The RAM cell compares the input signals applied to the two legs 102 and 104 during evaluation, and the result of this evaluation is reflected in the output signals out and outn. The transistors m5 through m12 and the multiple non-complementary clock signal arrangement of the FIG. 1 circuit 100 are eliminated. In addition to transistors m1, m2, m3 and m4, the circuit 200 further includes transistors m13, m14, m15, m16, m17, m18 and m19 arranged as shown. The transistors m1, m2, m13, m15, m17 and m18 are PMOS devices, and the transistors m3, m4, m14, m16 and m19 are NMOS devices.

Transistors m13 and m14 comprise a first series P-N channel that couples the left evaluation leg 102 to a corresponding side of the RAM cell of the circuit 200. Similarly, transistors m15 and m16 comprise a second series P-N channel that couples the right evaluation leg 104 to an opposite side of the RAM cell. A single clock signal ck is applied to the gates of m13, m14, m15, m16, m17, m18 and m19 as indicated in the figure. The RAM cell and the weighted arrays of the left and right evaluation legs 102 and 104 operate substantially in the manner described previously in conjunction with FIG. 1. The single clock signal ck is used to enable the RAM cell as well as to enable the introduction of the input signals A and B into the RAM cell.

Such an arrangement is particularly well-suited for use with non-complementary inputs, since once the inputs are introduced into the RAM cell, they are disconnected therefrom to ensure that the circuit 200 does not dissipate an excessive amount of power in its evaluation mode of operation. The operation of the improved sampling structures of the FIG. 2A circuit will be described in greater detail below in conjunction with FIG. 4.

Figure 2B:
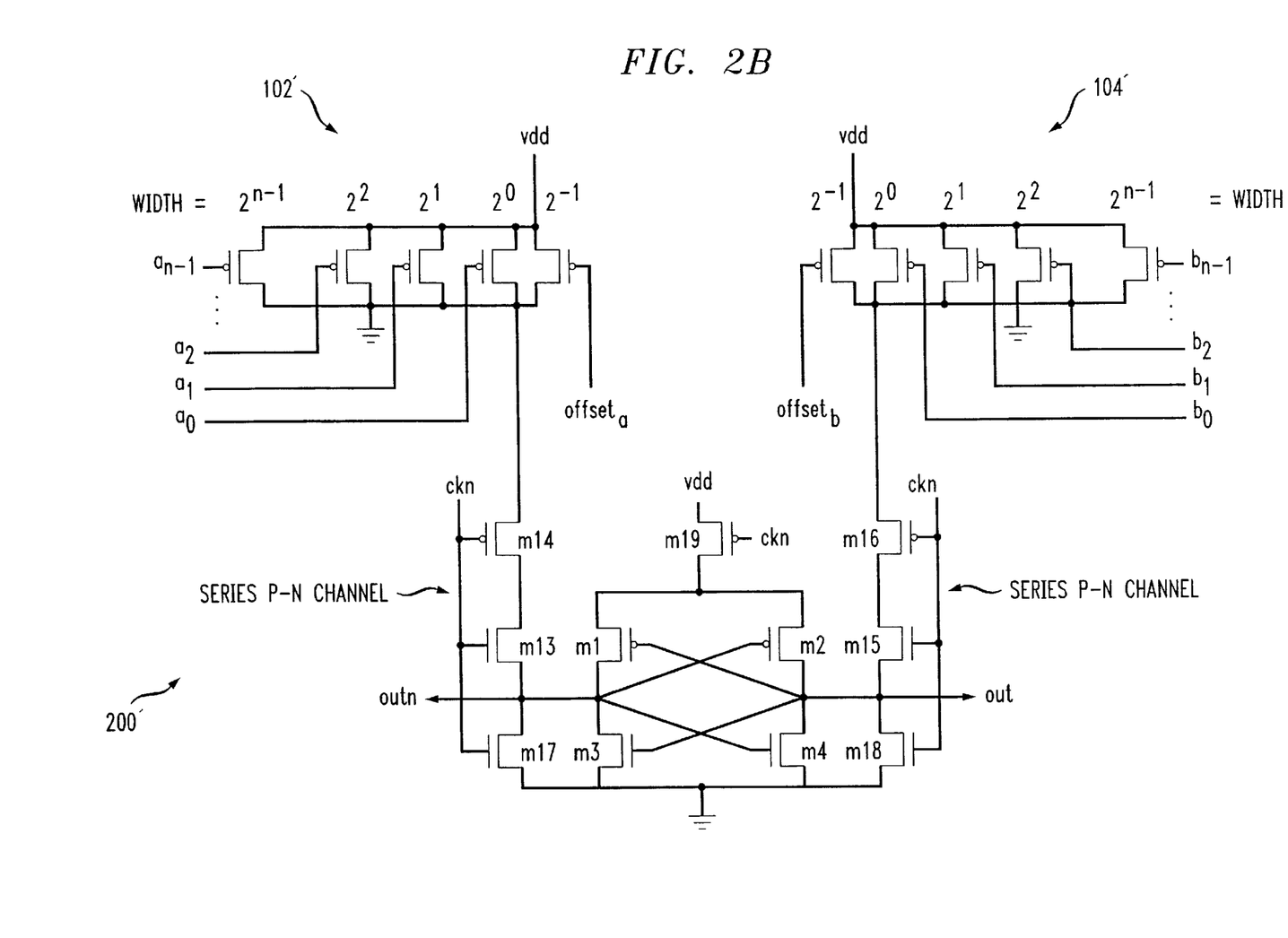

FIG. 2B illustrates an alternative implementation of a data capture circuit 200' in accordance with the invention. In this implementation, the channel type of the transistors m13, m14, m15, m16, m17, m18 and m19 is reversed, i.e., transistors m13, m15, m17 and m18 are now NMOS devices rather than PMOS devices, and transistors m14, m16 and m19 are now PMOS devices rather than NMOS devices. The transistors in the weighted arrays of the left and right evaluation legs 102' and 104' are now PMOS devices rather than NMOS devices. The configuration of the RAM cell comprising transistors m1, m2, m3 and m4 is unchanged from its configuration in the FIG. 2A embodiment, but transistor m19 is now coupled between transistors m1, m2 and Vdd, with transistors m3 and m4 being coupled directly to Vss or ground. The single clock signal applied to the gates of m13, m14, m15, m16, m17, m18 and m19 in FIG. 2B is a complemented clock signal ckn which corresponds to the complement of the clock signal ck used in the FIG. 2A embodiment. Also as in the FIG. 2A embodiment, transistors m13 and m14 comprise a first series P-N channel that couples the left evaluation leg 102' to a corresponding side of the RAM cell of the circuit 200', and transistors m15 and m16 comprise a second series P-N channel that couples the right evaluation leg 104' to an opposite side of the RAM cell.

It should be understood that the particular input legs shown in FIGS. 2A and 2B are by way of example only, and not requirements of the invention, as will be described below in conjunction with FIG. 3. Moreover, the output terminals of the circuits in FIGS. 2A and 2B may be further processed through additional circuitry, such as the output inverters INV1 and INV2 used in the FIG. 1 circuit.

Figure 3:
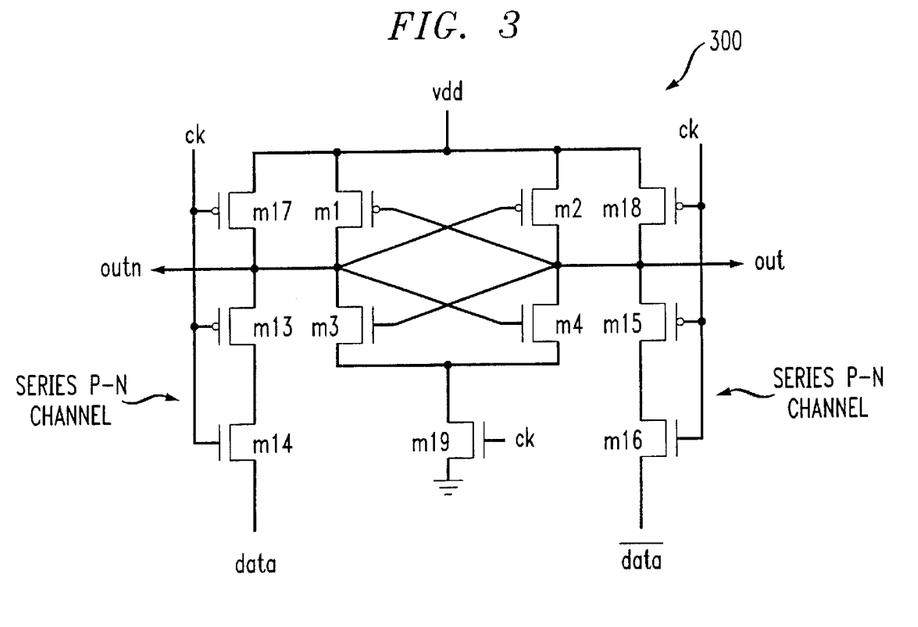
FIG. 3 shows a more general version of the example data capture circuit of FIG. 2A.

FIG. 3 shows a more general version of the example data capture circuit of FIG. 2A. In this embodiment, data capture circuit 300 includes the RAM cell and transistors m13, m14, m15, m16, m17, m18 and m19 as in FIG. 2A, but the left and right evaluation legs are eliminated, and complementary input signals data and data-bar are applied directly to the respective series P-N channel structures comprising transistor pairs m13, m14 and m15, m16. The data and data-bar signals may be applied from any suitable input structure or other signal source. Numerous input arrangements suitable for use with complementary or non-complementary inputs may be used in conjunction with the improved sampling structures of the present invention, and the invention is not limited in this regard.

A suitable size for each of the transistors in the transistor pairs m13, m14 and m15, m16 of the series P-N channel sampling structures in FIGS. 2A, 2B and 3 may be on the order of about 2 to 6 micrometers ($\mu$m) in channel width. In a given implementation, the two devices of a particular structure may both be approximately the same size, or the PMOS device could be made slightly larger in channel width than the NMOS device. It should be emphasized that the sizes given above are by way of example only, and the actual transistor sizes used in a given embodiment will generally vary depending upon factors such as desired speed of operation, as will be appreciated by those skilled in the art.

Although the circuits of FIGS. 2A, 2B and 3 and other illustrative embodiments of the invention utilize a RAM cell as an evaluation element, the invention can also be used with other types of memory cells, as well as other types of evaluation elements. The use of a RAM cell is therefore by way of example only, and should not be construed as limiting the invention in any way. The term "evaluation element" as used herein is intended to include a memory cell, a cross-coupled differential amplifier, other types of differential amplifiers, as well as other circuits capable of performing evaluations of the type described herein in conjunction with the illustrative embodiments, or of otherwise receiving an input signal from a series channel sampling structure of the type described herein.

Figure 4:
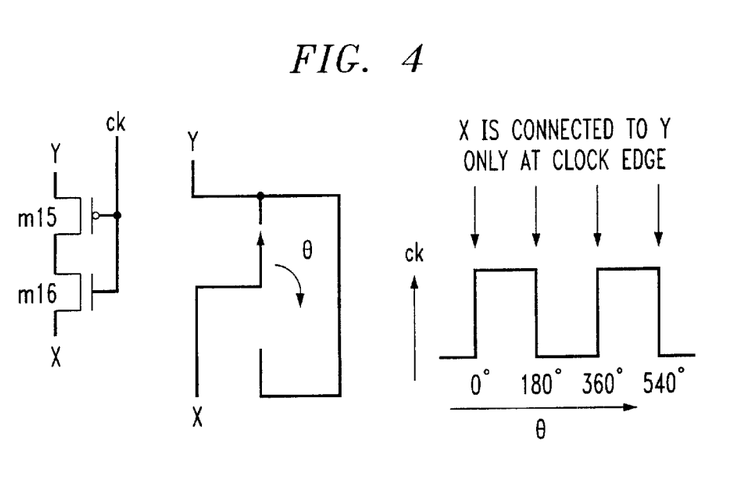
FIG. 4 illustrates the operation of a series P-N channel sampling structure in the data capture circuit of FIG. 3.

FIG. 4 illustrates in greater detail the operation of a given one of the series P-N channel sampling structures in the data capture circuit of FIG. 3. The series P-N channel sampling structure comprising PMOS transistor m15 and NMOS transistor m16 on the left side of the figure is shown for clarity and simplicity of illustration as being connected between points X and Y, where point X in FIG. 4 corresponds to the data-bar input of FIG. 3, and point Y in FIG. 4 corresponds to the out terminal of the circuit 300 in FIG. 3. A similar structure may be configured for transistors m13 and m14 in FIG. 3.

This series P-N sampling structure operates substantially as a switch structure which connects points X and Y only at the rising and falling edges of the clock signal ck, as illustrated in the middle and right side of the figure. More particularly, once the clock signal ck is stable at a logic high level, m15 is off and m16 is on, such that X and Y are not connected. Similarly, once the clock signal ck is stable at a logic low level, m15 is on and m16 is off, such that X and Y are not connected. However, during the transitions in the clock signal ck from logic high to logic low and from logic low to logic high, X and Y are connected. The series P-N channel sampling structure is thus enabled twice in a given clock cycle, i.e., at the rising edge and the falling edge of a given clock pulse. This does not create problems in the FIG. 3 circuit since the RAM cell in that circuit is being enabled and subsequently disabled or precharged during a given clock cycle.

The switch in FIG. 4 thus connects points X and Y only at values of clock phase θ corresponding to transitions in the clock signal ck, e.g., at values of θ=0°, 180°, 360°, 540°and so on, as indicated on the right side of the figure.

In the foregoing example, the connection of points X and Y occurs only at the transitions in the clock signal ck. It should be understood, however, that in other embodiments, the connection of these points may be made at or near a given clock signal transition, or may be made at the transition and then remain connected for a period of time, e.g., a period of time much less than the clock period. These and other types of connection that may be made utilizing the series channel sampling structures of the invention are intended to be encompassed by the term "substantially at transitions" of a clock signal, as used herein.

Figure 5:
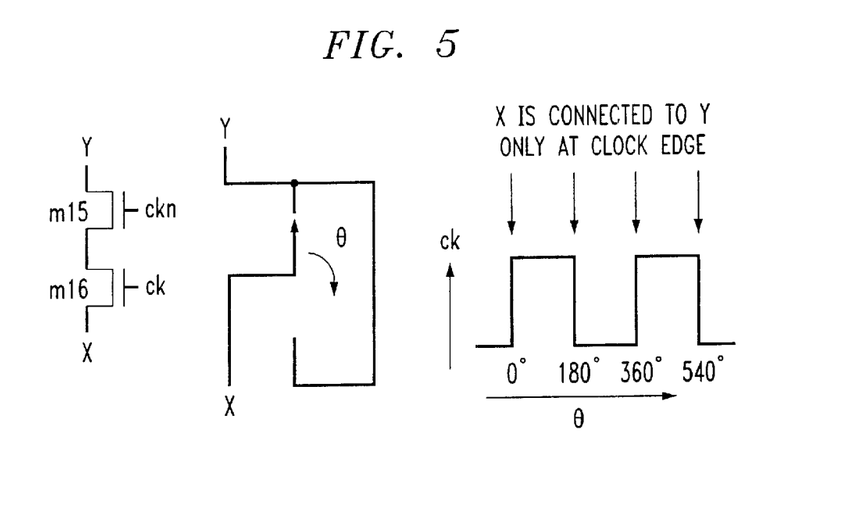
FIG. 5 illustrates the operation of an alternative sampling structure comprising a series N-N channel sampling structure in accordance with the invention.

FIG. 5 illustrates the operation of an alternative configuration of a series channel sampling structure in accordance with the invention. In this alternative configuration, transistors m15 and m16 are both NMOS devices, with m15 being clocked by ckn and m16 being clocked by ck, where as noted previously, ckn is the complement of ck. This sampling structure is therefore referred to herein as a series N-N channel sampling structure. A similar structure may be configured for transistors m13 and m14 in FIG. 3.

The operation of the series N-N channel sampling structure of FIG. 5 is substantially the same as that of FIG. 4, but makes use of the clock signal ck and its complement ckn rather than just the clock signal ck as in the FIG. 4 embodiment. More particularly, once the clock signal ck is stable at a logic high level and thus ckn is stable at a logic low level, m15 is off and m16 is on, such that X and Y are not connected. Similarly, once the clock signal ck is stable at a logic low level and thus ckn is stable at a logic high level, m15 is on and m16 is off, such that X and Y are not connected. However, during the transitions in the clock signal ck from logic high to logic low and from logic low to logic high, X and Y are connected. The series N-N channel sampling structure is thus enabled twice in a given clock cycle, i.e., at the rising edge and the falling edge of a given clock pulse. Like the FIG. 4 switch, the switch shown in the middle of FIG. 5 connects points X and Y only at values of clock phase θ corresponding to transitions in the clock signal ck, e.g., at values of θ=0°, 180°, 360°, 540° and so on, as indicated on the right side of the figure.

Figure 6:
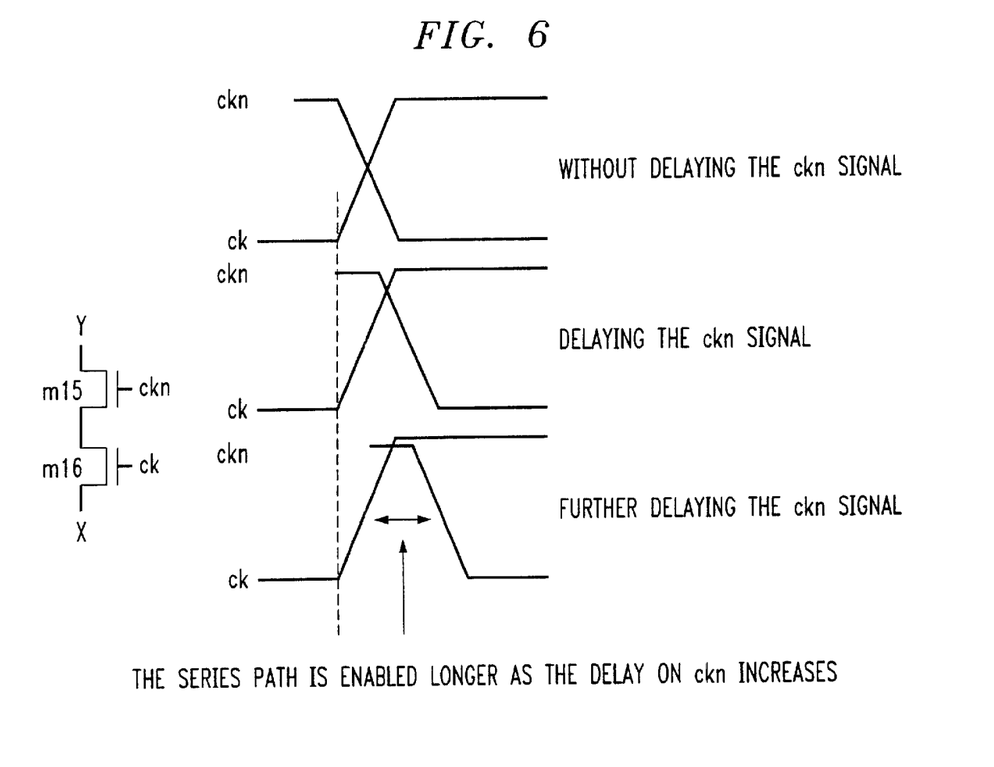
FIG. 6 is a timing diagram further illustrating the operation of the series N-N channel sampling structure of FIG. 5.

FIG. 6 is a timing diagram further illustrating the operation of the series N-N channel sampling structure of FIG. 5. It can be seen that the series path through the series N-N channel sampling structure in this embodiment is enabled for a longer period of time as the complementary clock signal ckn is further delayed relative to its undelayed position. The delay between the ck and ckn clock signals can thus be used to control the amount of time that the series N-N channel sampling structure remains in a closed position, i.e., in the position in which point X is connected to point Y in FIG. 5, after a given clock signal transition. The adjustment in delay can be provided using a tapped delay line or other suitable mechanism, as will be readily appreciated by those skilled in the art.

It should be noted that another alternative sampling structure similar to the series N-N channel sampling structure of FIGS. 5 and 6 can also be implemented using a pair of series-connected PMOS devices. Such a structure is referred to herein as a series P-P channel sampling structure, and operates in a manner analogous to the series N-N channel sampling structure of FIGS. 5 and 6.

The devices of the series N-N channel sampling structure and series P-P channel sampling structure described above may be sized in a manner similar to that described previously with regard to the series P-N channel sampling structures.

Figure 7:
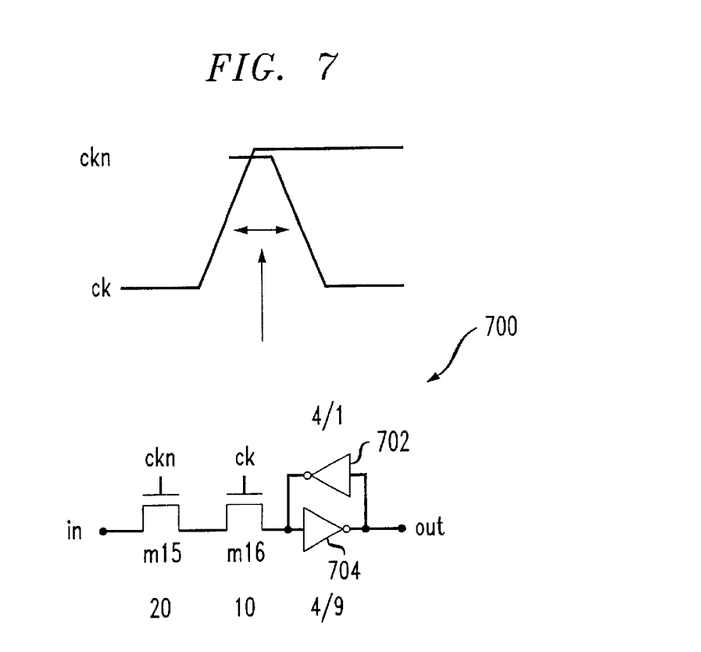
FIG. 7 illustrates the manner in which the series N-N channel sampling structure of FIG. 5 may be utilized to implement a data capture circuit in the form of a flip-flop.

FIG. 7 illustrates the manner in which the series N-N channel sampling structure of FIGS. 5 and 6 may be utilized to implement a data capture circuit 700 in the form of a flip-flop. In this embodiment of the invention, the series N-N channel sampling structure comprising m15 and m16 is coupled to a pair of inverters 702 and 704. The inverters 702 and 704 are interconnected so as to implement a memory cell of the type formed by transistors m1, m2, m3 and m4 in the embodiments previously described. The ck and ckn signals are delayed relative to one another as shown, using an appropriate delay mechanism of a conventional type. An input signal applied to the in terminal of the circuit 700 will be sampled by the series channel sampling structure comprising m15 and m16, and thereby introduced into and captured by the memory cell comprising inverters 702 and 704. The captured data will appear at the terminal out of the circuit 700. The circuit 700 thus operates as a conventional flip-flop, but with the improved input sampling structure achieves a significant reduction in power consumption relative to conventional circuits. More particularly, power consumption is reduced by disconnecting the applied input signal at terminal in from the memory cell during an evaluation mode of operation of the circuit 700.

Example transistor sizes for the MOS devices in the circuit 700 are shown in the figure in terms of channel width in micrometers ($\mu$m). Specifically, devices m15 and m16 in this example have channel widths of 20 $\mu$m and 10 $\mu$m, respectively, while the NMOS, PMOS device pairs of inverters 702 and 704 have respective channel widths of 4 $\mu$m, 1 $\mu$m and 4 $\mu$m, 9 $\mu$m. It is to be appreciated that these particular transistor dimensions are given by way of example only, and should therefore not be construed as limitations of the invention.

Another important advantage of the series channel sampling structure of the present invention is that it can improve the speed of operation of a data capture circuit. For example, the sampling structure increases the speed at which a given input signal can be introduced into the memory cell of circuit 700, as well as the speed at which the memory cell is precharged for a subsequent evaluation. More particularly, the edge-triggered switching action in the circuit 700, provided by the series N-N channel sampling structure comprising m15 and m16, allows the flip-flop to operate as a single-cell data capture circuit without a corresponding slave circuit, and thereby with reduced delay and improved operating speed.

Figure 8:
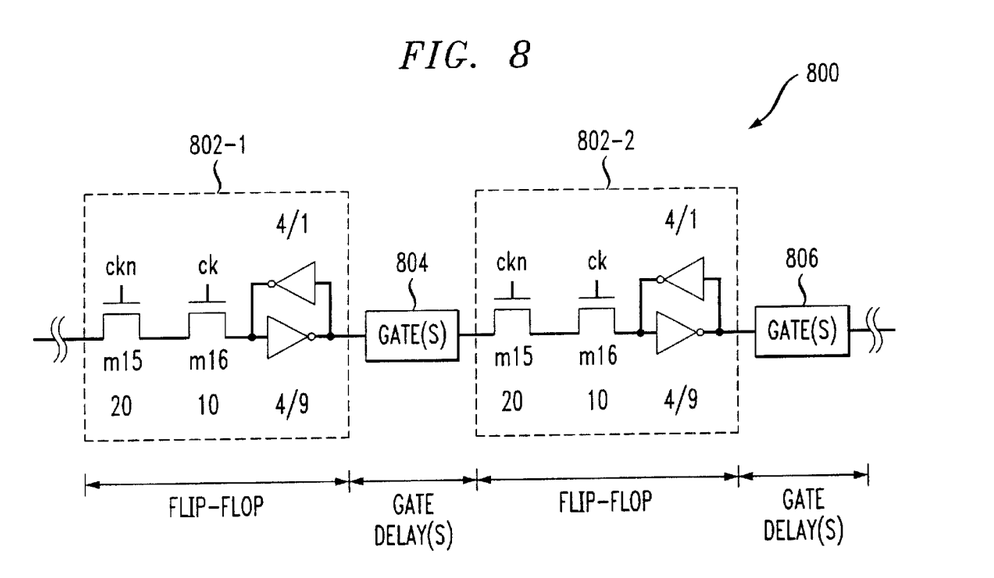
FIG. 8 shows an illustrative embodiment of a multiple flip-flop data capture circuit constructed using the flip-flop of FIG. 7.

FIG. 8 shows an illustrative embodiment of a multiple flip-flop data capture circuit 800 constructed using the flip-flop of FIG. 7. The data capture circuit 800 includes a first flip-flop 802-1 and a second flip-flop 802-2, both configured and operating in the manner described in conjunction with FIG. 7. The data capture circuit 800 further comprises two additional gate sets 804 and 806 each having one or more logic gates. The first set of logic gates 804 is coupled between an output of the flip-flop 802-1 and an input of the flip-flop 802-2, and the second set of logic gates 806 has its input coupled to an output of the flip-flop 802-2. The use of the improved single-cell flip-flops 802-1 and 802-2 allows the circuit 800 to tolerate additional gate delays in the sets of gates 804 and 806, and thereby improves its speed of operation, while also reducing power consumption in the manner previously described.

Although the use of two series-connected MOS devices or other transistors to form a given series channel sampling structure is preferred, other embodiments may use more than two transistors. It is expected, however, that optimal performance may more difficult to achieve if more than two transistor channels are used to form a given series channel.

As indicated above, the invention can be applied to complementary input signals, non-complementary input signals and single-ended input signals. The invention is also applicable to any other type of signal or signal line, including signals or signal lines internal to a given circuit such as circuit 800 of FIG. 8. These and other signals and their corresponding signal lines are intended to be encompassed by the term "input" as used herein with reference to a given series channel sampling structure.

The above-described embodiments of the invention are provided by way of illustrative example and not limitation. For example, as previously noted, different device types and transistor technologies may be used in other embodiments. In addition, the basic series channel sampling structure described herein may be implemented in other configurations, and can be used in higher level circuit applications other than those specifically described herein. Also, the data capture circuits of the present invention may be implemented in the form of an integrated circuit which may or may not include additional circuit components or other processing or memory elements. Furthermore, as described in more detail above, the invention can operate with different types of memory cells or other evaluation elements. These and numerous other alternative embodiments within the scope of the following claims will be readily apparent to those skilled in the art.

What is claimed is:

1. A data capture circuit comprising:
   a series channel sampling structure having an input and an output; and
   an evaluation element having an input coupled to the output of the series channel sampling structure;
   wherein the series channel sampling structure comprises a plurality of transistor devices configured for operation under control of at least one clock signal to connect an input signal, applied to the input of the series channel sampling structure, to the input of the evaluation element, and to subsequently disconnect the input signal from the input of the evaluation element, the connection of the input signal to the input of the evaluation element occurring substantially at transitions of the clock signal; and
   wherein the plurality of transistor devices comprises a PMOS transistor and an NMOS transistor having their channels connected in series.

2. The data capture circuit of claim 1 wherein the series channel sampling structure comprises a series P-N channel sampling structure comprising the PMOS transistor and the NMOS transistor.

3. The data capture circuit of claim 1 wherein the same clock signal is applied to gate terminals of the PMOS and NMOS transistors.

4. The data capture circuit of claim 1 wherein a first clock signal is applied to a gate terminal of a first one of the MOS transistors and a complemented version of the first clock signal is applied to a gate terminal of the other MOS transistor, with an amount of delay introduced between a transition of the first clock signal and a corresponding transition in the complemented version of the first clock signal, such that the series channel sampling structure remains conductive after the transition of the first clock signal for a period of time corresponding to the amount of introduced delay.

5. The data capture circuit of claim 1 wherein the evaluation element comprises a memory cell.

6. The data capture circuit of claim 1 wherein the circuit comprises a flip-flop.

7. The data capture circuit of claim 1 further comprising a first series channel sampling structure coupled to a first node of the evaluation element and a second series channel sampling structure coupled to a second node of the evaluation element, each of the series channel sampling structures being operative to connect and disconnect a corresponding input signal from the associated node of the evaluation element under the control of the at least one clock signal.

8. The data capture circuit of claim 7 wherein the input signals comprise non-complementary input signals.

9. The data capture circuit of claim 7 wherein the first and second series channel sampling structures are associated with respective first and second input legs of the data capture circuit, wherein at least one of the first and second input legs comprises a weighted array of transistors, each of the transistors in the weighted array adapted to receive a particular portion of an input signal applied to that leg.

10. The data capture circuit of claim 9 wherein each of the first and second input legs comprises a weighted array of transistors, and wherein first and second input signals applied to respective ones of the first and second input legs each comprise a digital word having a plurality of bits, and wherein each transistor of the associated weighted array of transistors is adapted to receive as an input a corresponding bit of a given one of the digital words.

11. The data capture circuit of claim 10 wherein the transistors of the weighted array are weighted in accordance with factors $2^0, 2^1, \ldots 2^{n-1}$ in width and the weighted array is adapted to receive a corresponding input signal comprising an n-bit digital word.

12. The data capture circuit of claim 9 wherein the weighted array comprises an additional transistor having an input adapted to receive an offset signal, the offset signal being configured so as to ensure a predictable output result if evaluation of first and second input signals, applied to respective ones of the first and second input legs, by the evaluation element would otherwise result in an unpredictable output.

13. An integrated circuit comprising at least one data capture circuit, each of at least a subset of the data capture circuits comprising:

a series channel sampling structure having an input and an output; and an evaluation element having an input coupled to the output of the series channel sampling structure;

wherein the series channel sampling structure comprises a plurality of transistor devices configured for operation under control of at least one clock signal to connect an input signal, applied to the input of the series channel sampling structure, to the input of the evaluation element, and to subsequently disconnect the input signal from the input of the evaluation element, the connection of the input signal to the input of the evaluation element occurring substantially at transitions of the clock signal; and wherein the plurality of transistor devices comprises a PMOS transistor and an NMOS transistor having their channels connected in series.

* * * * *